(12) United States Patent
Zhang et al.

(10) Patent No.: US 9,214,429 B2
(45) Date of Patent: Dec. 15, 2015

(54) TRENCH INTERCONNECT HAVING REDUCED FRINGE CAPACITANCE

(71) Applicants: STMicroelectronics, Inc., Coppell, TX (US); International Business Machines Corporation, Armonk, NY (US)

(72) Inventors: John H. Zhang, Altamont, NY (US); Hsueh-Chung Chen, Cohoes, NY (US); Lawrence A. Clevenger, LaGrangeville, NY (US); Yann Mignot, Slingerlands, NY (US); Carl Radens, LaGrangeville, NY (US); Richard Stephen Wise, Ridgefield, CT (US); Yannick Loquet, Domene (FR); Yiheng Xu, Hopewell Junction, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/098,346

(22) Filed: Dec. 5, 2013

(65) Prior Publication Data

US 2015/0162278 A1  Jun. 11, 2015

(51) Int. Cl.
*H01L 23/48* (2006.01)
*H01L 23/52* (2006.01)
(Continued)

(52) U.S. Cl.
CPC ...... *H01L 23/53295* (2013.01); *H01L 21/7682* (2013.01); *H01L 21/76807* (2013.01); *H01L 21/76879* (2013.01); *H01L 23/5222* (2013.01); *H01L 23/5226* (2013.01); *H01L 23/5329* (2013.01); *H01L 2221/1094* (2013.01); *H01L 2924/0002* (2013.01)

(58) Field of Classification Search
CPC .............. H01L 2924/14; H01L 2924/01079; H01L 2924/01013
USPC ........... 257/536, 770, 773; 438/352, 382, 703
See application file for complete search history.

(56) References Cited

U.S. PATENT DOCUMENTS

| 4,666,556 A | 5/1987 | Fulton et al. |
| 7,138,329 B2 | 11/2006 | Lur et al. |

(Continued)

OTHER PUBLICATIONS

Lane et al., "Environmental Effects on Cracking and Delamination of Dielectric Films," IEEE Transactions on Device and Materials Reliability, vol. 4, No. 2, Jun. 2004, (6 pgs.).

(Continued)

*Primary Examiner* — Phuc Dang
(74) *Attorney, Agent, or Firm* — Seed IP Law Group PLLC

(57) ABSTRACT

Ultra-low-k dielectric materials used as inter-layer dielectrics in high-performance integrated circuits are prone to be structurally unstable. The Young's modulus of such materials is decreased, resulting in porosity, poor film strength, cracking, and voids. An alternative dual damascene interconnect structure incorporates deep air gaps into a high modulus dielectric material to maintain structural stability while reducing capacitance between adjacent nanowires. Incorporation of a deep air gap having k=1.0 compensates for the use of a higher modulus film having a dielectric constant greater than the typical ultra-low-k (ULK) dielectric value of about 2.2. The higher modulus film containing the deep air gap is used as an insulator and a means of reducing fringe capacitance between adjacent metal lines. The dielectric layer between two adjacent metal lines thus forms a ULK/high-modulus dielectric bi-layer.

20 Claims, 7 Drawing Sheets

(51) Int. Cl.
  *H01L 29/40* (2006.01)
  *H01L 23/532* (2006.01)
  *H01L 21/768* (2006.01)
  *H01L 23/522* (2006.01)

(56) References Cited

U.S. PATENT DOCUMENTS

| | | | |
|---|---|---|---|
| 7,172,980 | B2 | 2/2007 | Torres et al. |
| 7,969,010 | B2 | 6/2011 | Usami |
| 8,227,336 | B2 * | 7/2012 | Edelstein et al. ............ 438/637 |
| 8,383,507 | B2 * | 2/2013 | Chanda et al. ............... 438/623 |
| 8,900,990 | B2 | 12/2014 | Zhang |
| 2003/0176055 | A1 * | 9/2003 | Wu ............................... 438/618 |
| 2005/0208753 | A1 | 9/2005 | Ott et al. |
| 2007/0264820 | A1 * | 11/2007 | Liu et al. ..................... 438/624 |
| 2008/0044999 | A1 | 2/2008 | Dubin et al. |
| 2008/0265377 | A1 | 10/2008 | Clevenger et al. |
| 2009/0004844 | A1 * | 1/2009 | Hsia et al. .................... 438/626 |
| 2009/0081862 | A1 | 3/2009 | Chen et al. |
| 2009/0093112 | A1 * | 4/2009 | Al-Bayati ........... H01L 21/3105 438/618 |
| 2010/0252929 | A1 * | 10/2010 | Budrevich et al. ............ 257/751 |
| 2011/0084357 | A1 * | 4/2011 | Liu et al. ..................... 257/522 |
| 2011/0221062 | A1 * | 9/2011 | Clevenger et al. ............ 257/750 |
| 2011/0260326 | A1 * | 10/2011 | Clevenger et al. ............ 257/770 |
| 2012/0223411 | A1 * | 9/2012 | Cho et al. ..................... 257/531 |
| 2013/0207267 | A1 * | 8/2013 | Rho, II ............... H01L 2/76846 257/751 |
| 2014/0252625 | A1 * | 9/2014 | Ting et al. .................... 257/751 |
| 2014/0264896 | A1 * | 9/2014 | Lu et al. ....................... 257/773 |
| 2015/0076705 | A1 * | 3/2015 | Singh .................. H01L 23/481 257/774 |

OTHER PUBLICATIONS

Liniger et al., "Moisture-Driven Crack Growth in Blanket Low Dielectric Constant and Ultralow Dielectric Constant Films," Journal of Applied Physics, vol. 96, No. 6, Sep. 15, 2004 (6 pgs.).

Xu et al., "Synthesis and Characterization of Porous Polymeric Low Dielectric Constant Films" in Journal of Electronic Materials, vol. 30, No. 4, 2001. pp. 309-313.

Wu et al. "Advanced Metal Barrier Free Cu Damascene Interconnects with PECVD Silicon Carbide Barriers for 90/65-nm BEOL technology" in International Electron Devices Meeting 2002, pp. 595-598.

Martin et al. "Integration of SiCN as a Low K Etch Stop and Cu Passivation in a High Performance Cu/low k Interconnect" in International Proceedings of the IEEE 2002 Interconnect Technology Conference. pp. 42-44.

\* cited by examiner

*Properties of Ultra Low-k Dielectric Materials and $SiO_2$*

| Property | Low-k | SiO2 |
|---|---|---|
| Density (g/cm3) | 1.03 | 2.2 |
| Dielectric Cons. | 1.9-2.5 | 3.9 |
| Modulus (GPa) | 3-9 | 55-70 |
| Hardness (GPa) | 0.3-0.8 | 3.5 |
| Porosity (est.) | 35-65% | NA |
| Avg. Pore Size, nm | < 2.0-10 | NA |
| Thermal Conductivity (W/m K) | 0.26 | 1.4 |

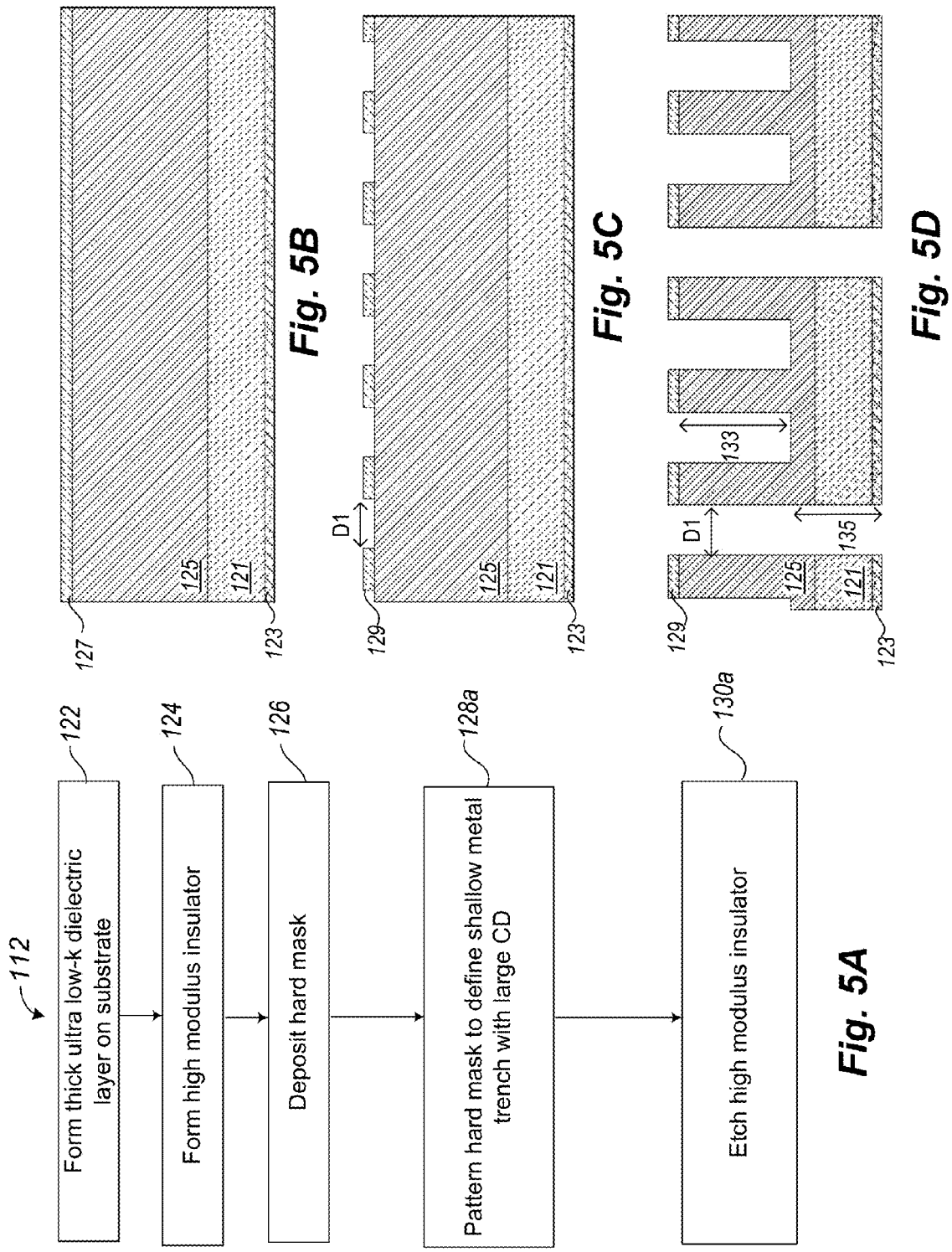

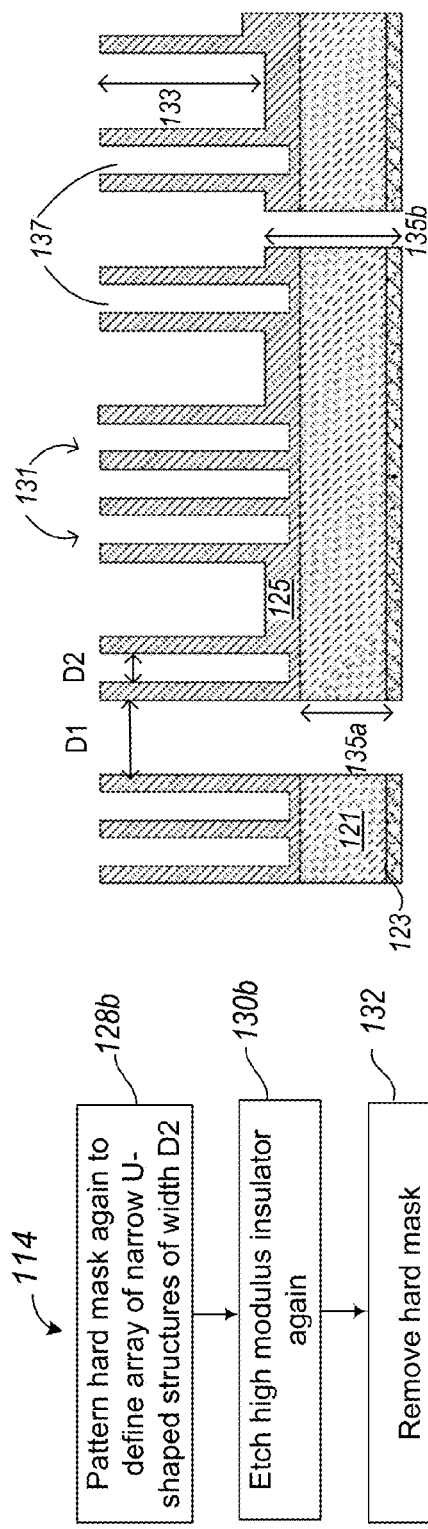
*Fig. 6B*
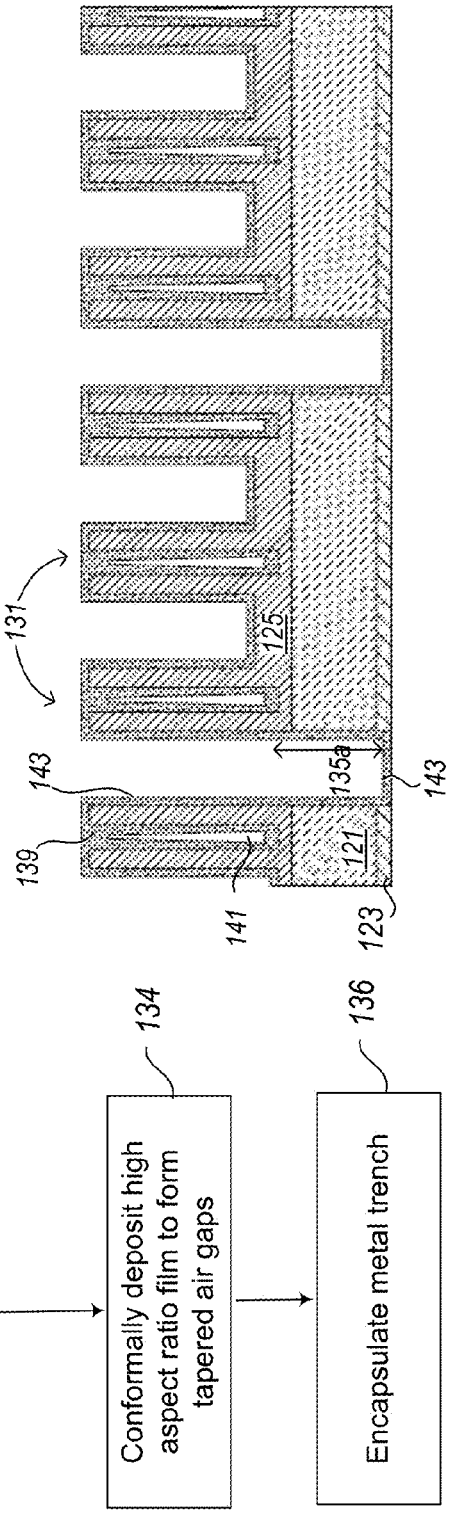
*Fig. 6C*
*Fig. 6A*

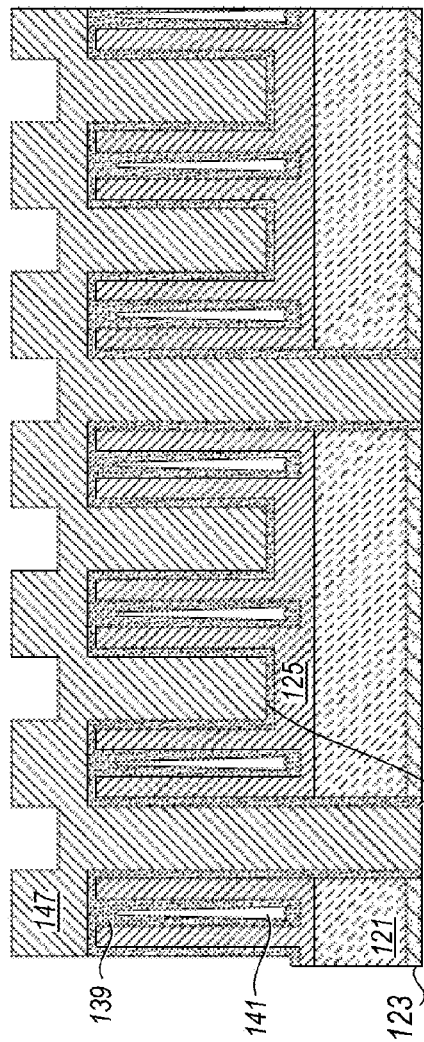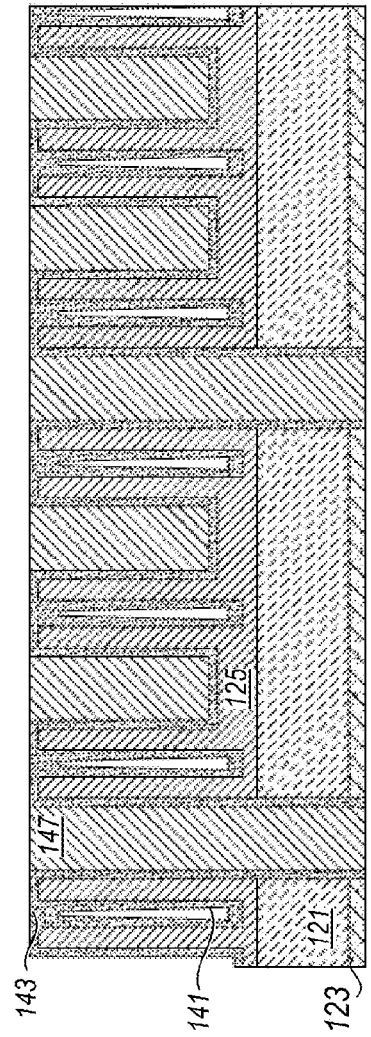

TRENCH INTERCONNECT HAVING REDUCED FRINGE CAPACITANCE

BACKGROUND

1. Technical Field

The present disclosure relates to the fabrication of nanowires for interconnecting integrated circuits and, in particular, to improvements in performance and reliability of inter-layer dielectrics used in a dual damascene process.

2. Description of the Related Art

There has been widespread use of damascene interconnect structures in microcircuit fabrication since the late 1990s when the semiconductor industry shifted from aluminum to copper metallization. A damascene interconnect process forms inlaid copper wiring by first etching trenches in a dielectric material, and then filling the trenches with copper, typically using a plating process such as, for example, electroplating. Through the use of a damascene process, semiconductor manufacturers can avoid etching copper. The term "dual damascene" refers to a process in which vertically adjacent metal lines and vias connecting them are formed in the same dielectric layer. FIG. 1 shows an inlaid metal structure 80 formed by such a dual damascene process, in which metal lines 82 and 84 are connected by a via 86 formed in a dielectric layer 88. A dual damascene process permits filling the trench for the upper metal line 84, and the via 86, in the same metal deposition step. Dual damascene integration schemes can, for example, form the via 86 first, and then the trench for the upper metal line 84, and then fill both at the same time. Or, the trench for the upper metal line 84 can be formed first, and then the via 86. Typically, trenches are wider than vias, so that an element of the final interconnect structure that includes the upper metal line 84 and the via 86 resembles a "T" shape as shown in FIG. 1. Alternatively, the trench widths and the via width connecting the trenches may be of comparable size, in which case an element of the final interconnect structure above the lower metal line 82 resembles a straight column, or an "I" shape, instead of a "T" shape.

Current trends in the fabrication of dual damascene interconnect structures for integrated circuits include investigating mechanical properties of low dielectric constant (low-k) and ultra-low-k (ULK) dielectric materials used as insulation between the metal lines and the vias. Generally, it is desirable to use electrically insulating material that has a low dielectric constant, to reduce capacitance between adjacent nanowires. However, as the dielectric constant of such materials is reduced below a value of about 2.4 to achieve better electrical performance, the dielectric materials are becoming become more porous, with problematic consequences, as described below.

Illustrations of damascene structures that employ ULK inter-layer dielectrics as shown in FIGS. 2A-2D are found in an industry presentation given at Stanford University by the consortium Sematech International, entitled "Overview of Dual Damascene Cu/Low-k Interconnect." A porous ULK dielectric film 90 used as an inter-layer dielectric is shown in FIG. 2A, as indicated by holes 92 distributed throughout the material. The holes 92 in this example are as large as several tens of nm across. Consequently, mechanical properties such as the Young's modulus, cohesive strength, and adhesion of such porous films are degraded. For example, the modulus of such a porous film scales with the dielectric constant such that ULK films have low modulus, whereas higher k films have a higher modulus. As the structural stability of the ULK dielectric film 90 becomes compromised, cracks 94 tend to form in response to film stress, as shown in FIG. 2B. Such cracking can occur when the ULK dielectric film 90 is subjected to thermal cycling or high pressure conditions during further processing of a semiconductor wafer, or during electronic packaging of a finished integrated circuit chip.

Another problem that tends to occur after etching ULK films is referred to as "dielectric flopover," in which high aspect ratio structures 96 have been found to be unstable and tend to lean sideways as shown in FIG. 2C. As minimum dimensions shrink, vias, which provide vertical connections between adjacent metal lines, become tall and thin. Such structures that have a height-to-width ratio of greater than in the general range of 3 or 4 are referred to as high aspect ratio structures. It is more difficult for metal deposition processes to fill high aspect ratio vias, which results in metal voids 98 as shown in FIG. 2D. In summary, ULK dielectrics tend to be mechanically unstable, and are prone to have poor strength, poor adhesion, dielectric flopover, cracks, and voids.

FIG. 3 shows a table 100 in which material properties of ULK materials are compared with those of conventional silicon dioxide ($SiO_2$) used as an inter-layer dielectric. With reference to the first and fifth rows of the table 100, it is seen that a reduction in the dielectric constant k from 2.2 to 1.03 is associated with an increase in porosity from 0 to about 50%. Accordingly, the modulus, hardness, and thermal conductivity of such ULK materials are each reduced by about a factor of 7, compared to conventional $SiO_2$.

BRIEF SUMMARY

An advanced damascene interconnect structure for microelectronic circuits incorporates a plurality of deep air gaps into a high modulus insulator to reduce capacitance between adjacent nanowires while maintaining structural stability. The nanowires are formed by an array of metal lines positioned among insulating columns. The embodiments presented herein are characterized by the inclusion of a high modulus insulator above a dielectric layer, and a high aspect ratio film inlaid within the high modulus insulator, sealing the deep air gaps. Related embodiments by the present inventors are disclosed in U.S. patent application Ser. No. 13/731,878, filed on Dec. 31, 2012.

The dielectric constant of air is 1.0, significantly lower than that of any solid material used in semiconductor fabrication. Thus, incorporation of a deep air gap in a layer compensates for the use of a higher modulus insulator film having a dielectric constant greater than the typical ULK value of about 2.2, such that the resulting interconnect structure has an effective dielectric constant less than 2.0. In the embodiments presented herein, the higher modulus film containing the deep air gap is used as an insulator between metal-filled trenches, for example, at the same level as metal 3 or metal 4 while the ULK film is retained to insulate vias. The dielectric layer between two adjacent metal lines might include both a ULK and a high-modulus dielectric having air gaps, thus forming a bi-layer.

In one embodiment, a fabrication method to form such an advanced damascene interconnect structure includes patterning dielectric U-shaped structures having a selected width-to-spacing ratio, creating deep air gaps within the U-shaped structures, and patterning an array of wide metal trenches between the U-shaped structures using a hard mask. Forming the dielectric U-shaped structures can be done by patterning the same hard mask again with narrow features. The deep air gaps extend below the depth of the metal trench array.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 5A is a detailed process flow diagram showing a sequence of process steps that can be used to create dielectric U-shaped structures, according to one embodiment.

FIGS. 5B-5D are cross-sectional views of profiles formed by each of the process steps shown FIG. 5A.

FIG. 6A is a detailed process flow diagram showing a sequence of process steps that can be used to create tapered deep air gaps within the U-shaped structures, according to one embodiment.

FIGS. 6B-6C are cross-sectional views of profiles formed by each of the process steps shown FIG. 6A.

FIG. 7A is a detailed process flow diagram showing a sequence of process steps that can be used to create metal lines between the U-shaped structures, according to a first embodiment.

FIGS. 7B-7C are cross-sectional views of profiles formed by each of the process steps shown FIG. 7A.

DETAILED DESCRIPTION

Figure 1:
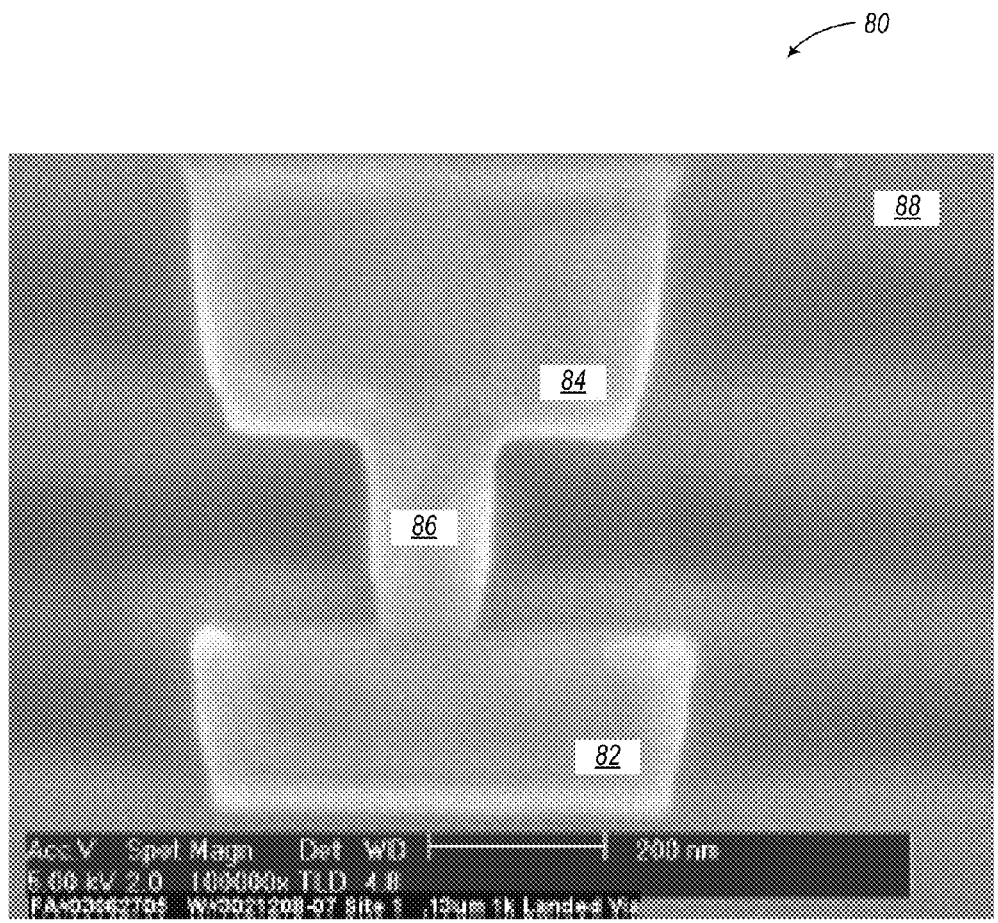
FIG. 1 is a cross-sectional micrograph of adjacent metal lines connected by a via, formed by a dual damascene fabrication process.
Figure 2B:
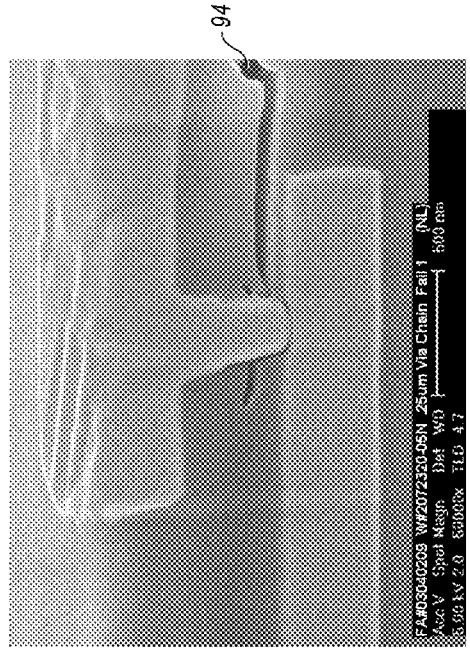
FIG. 2B is a failure analysis cross-sectional micrograph showing cracking in a ULK dielectric material.
Figure 2D:
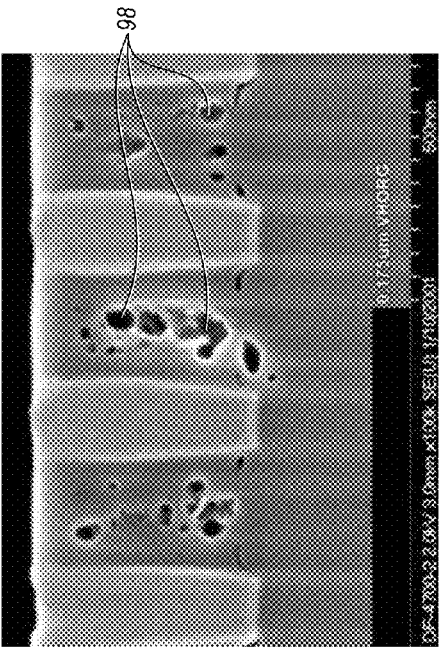
FIG. 2D is a failure analysis cross-sectional micrograph showing a large void in a ULK dielectric material.
Figure 2A:
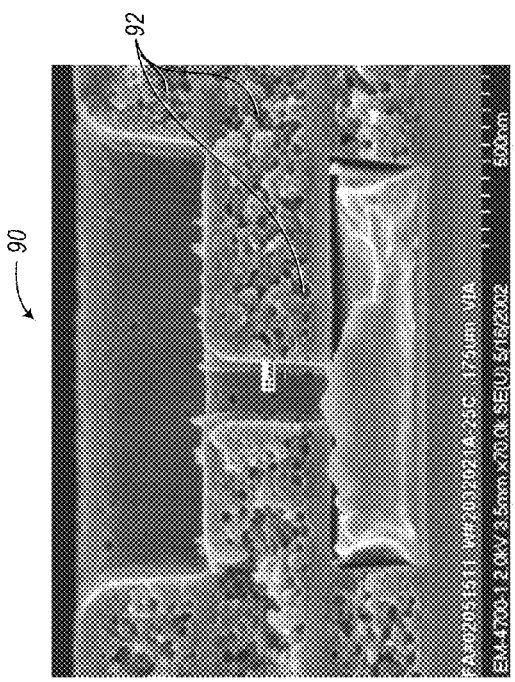
FIG. 2A is a failure analysis cross-sectional micrograph showing porosity of a ULK dielectric material.
Figure 2C:
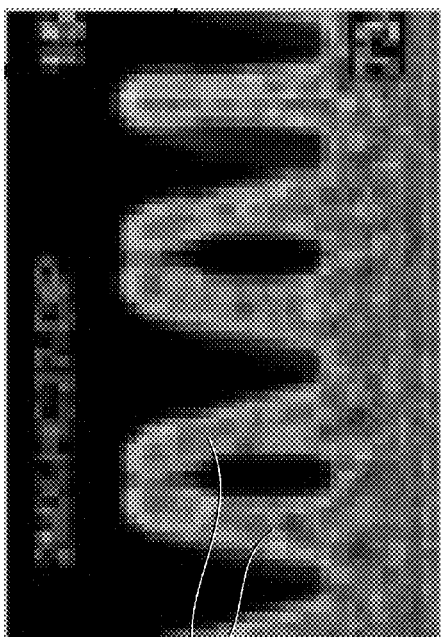
FIG. 2C is a failure analysis cross-sectional micrograph showing dielectric flopover in a ULK dielectric material.
Figure 3:
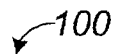
FIG. 3 is a table comparing material properties of ULK dielectrics and silicon dioxide used as a dielectric.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Fabrication of microcircuits generally entails performing a series of deposition and patterning operations to build integrated structures on a semiconductor substrate, one layer at a time. Each layer is formed by growing or depositing a film on the substrate, patterning a photo-sensitive mask using lithography, and transferring the mask pattern to the film by etching. Often, structures already formed on the substrate are protected by hard masks while new structures are created. Such use of hard masks adds masking layers to the fabrication process. Overall fabrication costs scale with the number of layers used and the number of mask patterning cycles needed. Lithography masks are expensive to design and to integrate into an existing fabrication process. For these reasons, it is generally advantageous to reduce the number of mask patterning cycles if alternative processing schemes can be substituted.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask such as a silicon nitride hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to planarized metal interconnect structures and photonic structures that have been produced; however, the present disclosure and the reference to certain materials, dimensions, and the details and ordering of processing steps are exemplary and should not be limited to those shown. The terms "planarize" and "polish" are used synonymously throughout the specification.

In the figures, identical reference numbers identify similar features or elements. The sizes and relative positions of the features in the figures are not necessarily drawn to scale.

Figure 4:
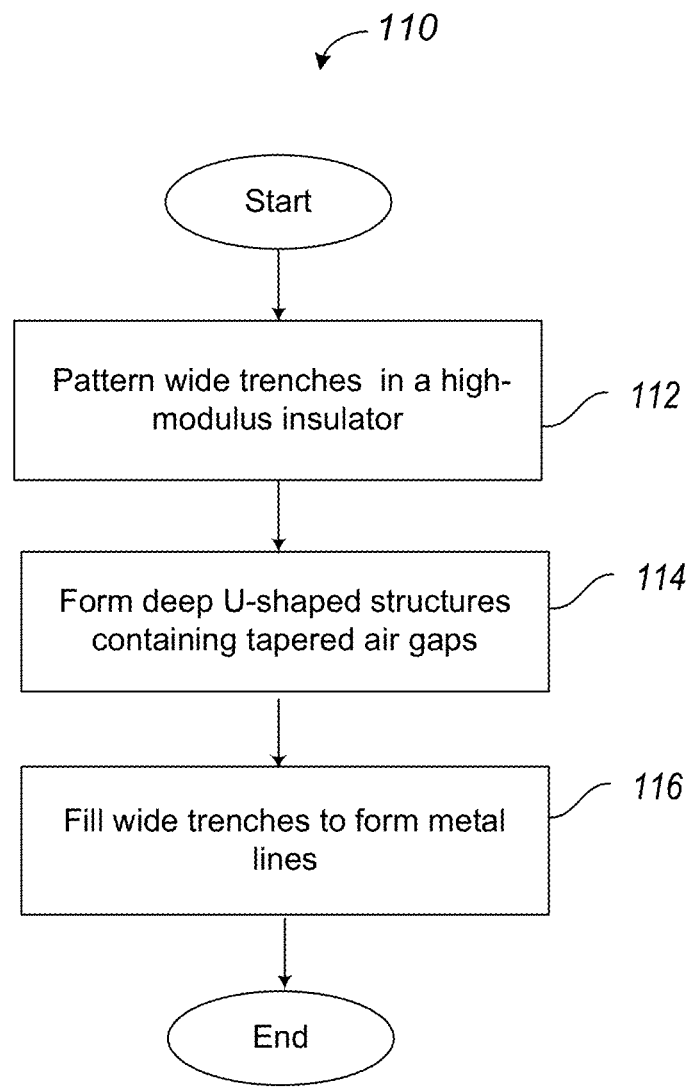
FIG. 4 is a high level flow diagram showing an overview of a method of making an advanced interconnect structure that includes deep air gaps, according to one embodiment.

FIG. 4 shows generalized steps in a fabrication method 110 for producing an advanced interconnect structure having deep air gaps, according to one embodiment described herein. The fabrication method 110 is similar to a method presented in a companion U.S. patent application Ser. No. 14/098,286 filed on the same day as this patent application. The method 110 presented herein addresses the potential problem of fringe capacitance that can occur within the interconnect structure between adjacent metal lines, typically at or near the lower corners of the metal lines. The fabrication method 110 presented herein produces an interconnect structure in which deep air gaps extend below the depth of the metal lines so as to interrupt development of fringe capacitance between adjacent metal lines.

At 112, a high-modulus insulator is patterned to form an array of shallow wide trenches of width D1. The trenches preferably have an aspect ratio of at least 2:1. The trenches will later be filled with metal.

At 114, deep U-shaped structures are formed, containing tapered air gaps.

At 116, trenches among the deep U-shaped structures are filled with metal.

Details of the fabrication method 110 are presented below, with reference to FIGS. 5A-7C.

FIGS. 5A-5D describe and show details of the step 112 that are carried out to form an array of wide trenches in a high-modulus insulator as shown in FIG. 5D, according to one embodiment described herein. Such structures can be formed in a variety of ways.

Shown in FIG. 5B is a dielectric film stack that has been formed over a substrate 123. In some embodiments, the substrate 123 is a combined set of layers formed either prior to or after a first metal interconnect layer. In such an example, the substrate 123 shown in the figures can represent a monocrystalline semiconductor substrate which has been overlaid with multiple layers. Such layers can include layers of oxides, nitrides, gate electrodes made of polysilicon or metal, sidewall spacers, contact openings, or other transistor-level features that are commonly formed before the first metal layer. Additionally or alternatively, the substrate 123 may include a silicon carbide-nitride $SiC_xN_y$ base layer having a thickness of about 15-32 nm with two or more metal layers and a semiconductor substrate below it. Alternatively, the substrate 123 can be a bare semiconductor wafer or one coated with an oxide layer.

At 122, a dielectric layer 121 is deposited on top of the substrate 123. The dielectric layer 121 can be any layer in which vias can be formed during the semiconductor manufacturing process. In one embodiment, the dielectric layer 121 is a thick inter-metal dielectric layer such as a low-k or ultra-low-k (ULK) dielectric, wherein k represents a dielectric constant that characterizes the dielectric material. In the embodiment shown, the ULK dielectric layer 121 desirably has a dielectric constant less than about 2.0 and a thickness target that determines the via height, for example, in the range of about 100-200 nm. Such an inter-metal dielectric layer may be located between metals 1 and 2, metals 3 and 4, or other metal interconnect layers, for example.

At 124, a high modulus insulator 125 is formed above the ULK dielectric layer 121. The high modulus insulator 125 can be made of, for example, a silicon nitride (SiN), silicon carbide (SiC), or silicon carbide-nitride $SiC_xN_y$. It can generally be a ULK dielectric, although known ULK dielectric materials lack sufficient strength to be considered high modulus insulators. Trenches for metal interconnect layers will later be formed in the high modulus insulator 125 to be filled with metal. The thickness target of the high modulus insulator 125 is in the range of about 200-400 nm.

Generally, the ULK dielectric layer 121 and the high modulus insulator 125 will be made of multiple sublayers. For example, it would be common to make ULK dielectric layer 121 having a first base layer of a type of silicon nitride on top of which is formed a nanopores or aerogel layer that includes some form of silicon dioxide or other layer. There may be two or three types of ULK dielectrics on top of each other within the main ULK dielectric layer 121. Similarly, the high modulus insulator 125 may have two or more sublayers making up the entire layer. For example, one of the sublayers may be a relatively strong layer having silicon, carbon, and nitrogen therein. It may also be a relatively strong layer having just silicon and carbon therein. Other sublayers of the high modulus insulator 125 may include silicon dioxide, silicon nitride, a ULK layer of any one of the many acceptable ULK materials or many other sublayers. In one embodiment, it is preferred to ensure that the high modulus insulator 125 has more mechanical strength than the ULK dielectric layer 121 to ensure that the air gaps to be formed at the regions D2 will be supported by structure and will not collapse. Even though the high modulus insulator 125 may be mechanically stronger, it may have a similar dielectric constant to that of the material used in the ULK dielectric layer 121 and, once the air gaps are formed, it may have a similar or even lower dielectric constant overall as a layer than that of the ULK dielectric layer 121.

At 126, a hard mask layer 127 is deposited on top of the high modulus insulator 125. In one embodiment, the hard mask layer 127 is made of metal to permit etching the very thick underlying high-modulus insulator 125.

At 128a, the hard mask layer 127 is patterned to form a hard mask 129 having a wide pitch of dimension D1. Patterning the hard mask layer 127 can be accomplished using a standard lithography/etch sequence of operations. The hard mask 129 can now be used to pattern the underlying high-modulus insulator 125.

At 130a, the high-modulus insulator 125 is etched to form shallow trenches of width D1. In one embodiment, the shallow trenches are spaced so as to have a 64-nm pitch. The etch process used is a plasma-based reactive ion etch that removes the high modulus insulator 125 to form trenches having a shallow trench depth 133 and a width D1. This is permitted in one embodiment by using a stiffer and stronger material in some parts of the ULK dielectric layer 121. In some locations, via openings 135 are etched following the shallow trench formation. Later in the process, when the via openings 135 are filled with metal, the filled vias will therefore be in contact with the metal layer that is below the top layer of the substrate 123. For example, if the metal layer being deposited into the trenches 133 is metal 4, then etching away the layer 123 will permit the via 135 to couple the underlying metal 3 to metal 4 at those particular locations, but the two metal layers will remain electrically isolated at those shallow trench locations where vias 135 are not formed.

In the embodiment shown in FIG. 5D, the trench width and the via width are substantially equivalent. In other embodiments, the trenches are wider than the vias, such that the via will be at or near the minimum dimension for that layer. In a semiconductor layout, the smallest that a feature can be made within a lithographic mask is sometimes called the "minimum dimension" and in another context is called the "critical dimension" (CD). For each mask layer, a design rule is established. These are simple, single layer rules that provide a width rule that specifies the minimum width of any shape in the design. The design rule also generally specifies a minimum spacing between two adjacent objects with a spacing rule. In some instances, the minimum spacing design rule will be a different distance than the minimum width design rule, while in some instances, the minimum distance for both the width of a feature and the distance between two adjacent features may also be the same. Generally, reference to the "minimum dimension" refers to the design rule that is the minimum width of any object within that particular mask layer. Further, the design rule dimensions are different for different layers. Generally, the layer at the semiconductor substrate level at which source, drains and channels are formed usually has the smallest possible design rules. Upper metal layers, for example, metal 3, metal 4, generally have much larger design rules. For example, the minimum width design rule at metal 4 may be two or three times larger than the corresponding minimum width design rule of metal 1. This is permitted because generally there are fewer metal interconnect lines at the upper metal levels, for example, at metal 4, 5 and higher, and therefore the design rules can be somewhat relaxed and permit the use of larger structures, which permits such structures to be more reliably formed with a lower likelihood of defects. In addition, the larger design rule permits larger features to be formed in the metal interconnect layers which provide significantly lower resistance and therefore more current carrying capability with less voltage loss. Therefore, the terms "minimum dimension" and "critical dimension" as used herein refer to the minimum size of a particular feature that the design rule permits for that particular individual layer to which it is applied.

FIGS. 6A-6C describe and show details of the step 114 that are carried out to form deep air gaps among encapsulated shallow trenches and vias, as shown in FIG. 6C, according to one embodiment described herein.

At 128b, the hard mask 129 remaining on top of the high modulus material between the trenches is patterned a second time, again using a standard lithography/etch sequence of operations.

At 130b, the re-patterned hard mask 129 is used to etch an array of U-shaped structures 131, having narrow recesses 137 of width D2. The narrow width D2 defines the width of a dielectric bi-layer that will include an air gap to electrically insulate adjacent metal lines and vias from one another. A target width-to-spacing ratio D2/D1 is set at 0.618, which is a golden ratio that yields a desired CD distribution. Etching the narrow recesses 137 can be targeted to a desired depth that is below the trench depth 133, but above the dielectric layer 121. Controlling the depth of the narrow recesses 137 helps to control the amount of fringe capacitance associated in particular with corner features of the shallow trenches.

At 132, the hard mask 129 is removed using an anisotropic RIE process that can remove metal without attacking the underlying SiN or $SiC_xN_y$ layers or other materials that might be part of the high modulus insulator 125 or the ULK dielectric layer 121.

FIG. 6B shows a variety of U-shaped structures 131 and trenches 133 following removal of the hard mask 129. Depending on the local mask design, the U-shaped structures 131 can alternate with the trenches 133, or there can be several U-shaped structures 131 between a pair of trenches 133. At the plane of the cross section shown in FIG. 6B, some of the trenches 133 are shown aligned with vias 135a having widths substantially equal to the trench width D1. Additionally or alternatively, trenches 133 can be aligned with vias 135b that are narrower than the trench width D1. Other trenches connect to vias that do not happen to intersect the cut plane shown.

At 134, the narrow recesses 137 of the U-shaped structures 131 are capped with a layer 139. As shown in FIG. 6C. FIG. 6C shows an exemplary embodiment in which an array of U-shaped structures 131 alternates with trenches or trench/via openings. The capping layer 139 will cap each U-shaped structure so as to include an air gap 141, thus forming a plurality of air gaps 141 each of which extends vertically within a recess 137. The capping layer 139 is desirably capable of capping the recesses 137 so as to close the small openings of size D2. In one embodiment, such a capping layer 139 includes a filler material made of SiC. The dimension D2 is selected in conjunction with the conformal film which is to form the capping layer 139. In one embodiment, the capping layer 139 is a conformal layer which conforms generally to the interior of the U-shaped structure 131 having a gap distance D2 and as it conformally fills the trench the top portion will touch and create a cap after which further filling of the trench is blocked, resulting in deep air gaps 141. Alternatively, the distance to the air gap D2 may be relatively small compared with the coverage capabilities of the capping layer 139 resulting in the cap being formed almost immediately upon the deposition starting so that little to no material from the capping layer 139 enters the U-shaped structure 131. Therefore, the top of the U-shaped structure 131 will be essentially capped and maintain nearly the same open area as when it was originally etched. There may be some small amount of capping layer material 139 deposited on the very bottom of the U-shaped structure 131 with little deposited on the sides before the layer caps the top of the U-shaped structure 131, thus sealing it off against further deposition of material. For layers which are very conformal, the distance D2 may be somewhat smaller in order to ensure that a cap is formed to seal it off prior to completely filling the U-shaped structure 131 to ensure that the deep air gap 141 remains. On the other hand, if the capping layer 139 is not very conformal and tends to deposit more heavily at the corners and on the top, it may be permitted to have D2 be a somewhat larger dimension and still be assured that the top will cap off while still leaving a deep air gap 141 inside of the U-shaped structure 131. Accordingly, the dimension D2 is selected to ensure that adjacent capping layers 139 will touch each other at the top opening of the U-shaped structures 131 to seal off the top and form a sealing cap before the central portion of the region is fully formed to ensure that the deep air gap 141 remains. As previously mentioned, in some embodiments the selection of the width D2 together with the material used for the capping layer 139 will result in a cap being formed at the top portion of the trench 131 with little to no material of the capping layer 139 in the trench, thus maintaining a larger air gap and a correspondingly smaller dielectric constant. Since the dielectric constant of the air is 1.0 and it is substantially smaller than that of any other material, it is desired to have the air gap as large as practical within the constraints of the materials used and to provide sufficient structural integrity for the high modulus layer 125 after the metal is deposited therein. In one embodiment, the material for the capping layer 139 is silicon carbide which has a high physical strength and can be adjusted to be deposited to be ensured that it will build up at the top of the U-shaped structure 131 to create a cap that seals off the U-shaped structure 131 when the U-shaped structure 131 is only partially filled with the capping layer 139, thus ensuring that the air gap 141 will be present. By custom selection of the width D2 and the deposition properties of the SiC, a relatively large air gap 141 can be obtained, in some instances nearly the entire dimension of the original volume of the U-shaped structure 131.

At 136, further deposition of the high aspect ratio film as the capping layer 139 closes the small recesses 137 of width D2. In the embodiment shown, the capping layer 139 also serves as an encapsulant 143, lining sidewalls of the shallow trenches that will be filled with metal. The encapsulant 143 also lines the bottoms of the vias temporarily, as shown in FIG. 6C, until the metal is deposited in the vias at a subsequent step. The encapsulant 143 helps to prevent current leakage between adjacent metal lines, as well as preventing failure modes known to those skilled in the art such as electromigration (EM) and time-dependent dielectric breakdown (TDDB). In other embodiments, the capping layer 139 may be planarized so it is even with the tops of the U-shaped structures 131, and then a separate encapsulant 143 may be deposited.

In one preferred embodiment, the capping film 139 is preferably a high aspect ratio film that enters into the recess 137 which has been etched, even though the recess 137 is a narrow aperture. A benefit of having a high aspect ratio film 139 is that it fills the interior of the recess 137 as well as providing the encapsulant 143 that lines the outside surfaces of the U-Shaped structures 131 with a narrow layer, thus reinforcing the mechanical strength of the walls 144 of the U-shaped structures 131. Preferably, each wall 144 has sufficient strength that it is both self-supporting and will not collapse or be crushed under the weight of additional layers which will be deposited on top of it during subsequent steps in the semiconductor process. In some process technologies, the recess 137 will be sufficiently large and the walls 144 sufficiently small that they do not have sufficient mechanical strength to support the layers which will be deposited on the top of them during subsequent semiconductor processing steps. Accordingly, the high aspect ratio film 139 is selected as a reinforcing material. In one example, silicon carbide (SiC) is selected as the reinforcing material, because SiC has high mechanical strength and yet it can be deposited as a thin layer with a high aspect ratio. Thus, a thin film encapsulant layer 143 is provided on each side of each wall 144, providing sufficient mechanical strength and reinforcement that when subsequent layers are deposited on top of the U-shaped structure 131 it can support this weight and not be crushed even though there is an air gap present within the U-shaped structure 131. Accordingly, the air gap 141 formed during deposition of the high aspect ratio film 139 is maintained with sufficient structural integrity because both the wall 144 and the high aspect ratio film 139 act together to provide sufficient mechanical strength so that air gap 141 may remain and yet the layer overall has sufficient strength that it does not collapse after subsequent layers are put on the top thereof during further semiconductor processing steps until the chip is completed.

The result shown in FIG. 6C is an array of insulating columns in the form of the U-shaped structures 131, each supporting within it a tapered air gap 141 that is sealed by the conformal layer 139. In other embodiments, the air gaps can take on different shapes, orientations, and arrangements. However, the air gaps 141 are generally contained within a structurally stable supporting column having a high modulus. Furthermore, the volume of trapped air is such that the effective dielectric constant of structure as a whole, that is, including the air, the high modulus structure, and the filler material is less than about 2.0

FIGS. 7A-7C describe and show details of the step 116 that are carried out to form encapsulated metal lines and vias, as shown in FIG. 7C according to one embodiment described herein. In the embodiment shown, the tapered air gaps 141 have a triangular shape that is wider at the bottom and narrows to a point at the top. However, alternative embodiments can include an air gap of any shape, or multiple air gaps, by design. In a sense, the controlled formation of the air gaps can be thought of as a way of designing and engineering porosity into a high-strength material.

In those vias 135 in which contact to a lower metal layer is desired, the encapsulant 143 will generally be etched away from the bottom of the via 135 in order to ensure that the bulk metal 147 will contact the metal layer below. Such etching can occur during deposition of the bulk metal 147 by using ion bombardment to remove, anisotropically, the thin layer of encapsulant 143 at the bottom of the vias 135, while leaving the encapsulant 143 in place on the sidewalls of the trenches 133 and vias 135. The bulk metal 147 thus establishes a conductive path between a metal layer below the substrate 123, if applicable, and the current metal layer. In the example of FIG. 7B, the encapsulant 143 is shown etched away at some of the locations, while being present at other locations at which it is desired to not have a via extend completely from, for example, metal 4 to metal 3. At those locations in which the via does not extend all the way from one metal layer to another, it may also be that the via depth is not fully etched all the way down and instead more insulating material may be left between the adjacent metal layers in order to ensure that there is no electrical contact at those locations. Often, such a design will include dummy structures in order to provide smooth etching and a well-balanced layout. Therefore, there may be a number of instances in which metal is deposited into those locations in which no via is formed and there will be no subsequent electrical connection to the metal. Nevertheless, the via is present in order to form a dummy structure which has a number of benefits in semiconductor processing, as is well known in the art and need not be described in detail herein.

At 140, the shallow trenches 133, are filled with a bulk metal 147. The bulk metal trench fill material in the embodiment shown is desirably a metal suitable for use as a nanowire interconnect material. Such bulk metals include, for example, copper, aluminum, tungsten, silver, gold, titanium, platinum, tantalum, or combinations thereof. Combinations of such metals include layered metal stacks or alloys. The bulk metal trench fill process can be a plasma deposition such as chemical vapor deposition (CVD) or plasma vapor deposition (PVD). Alternatively, the bulk metal trench fill process can be a plating process such as electroplating or electro-less plating. In one embodiment, a plating process is used that includes depositing a copper seed layer followed by a bulk copper layer. The metal fill process is preferably conformal. Because the metal CD has a large width D1 and a shallow depth 133, there should not be a gap fill problem.

At 142, the bulk metal 147 is polished to stop on the high aspect ratio film 139. The CMP process used for polishing the bulk metal 147 can entail use of a slurry made from silica and hydrogen peroxide ($H_2O_2$), and a soft polish pad, for example. The CMP process can be timed based on a known polishing rate of the bulk metal material. Or, the CMP process can be end-pointed to stop upon detection that the underlying high aspect ratio film 139 layer has been exposed. Additionally or alternatively, a touch CMP process can further be performed to gently remove remnants of the surplus bulk metal 147. The touch CMP process can be a brief surface polish in which the polish pad rotation speed and pressure are set to relatively low values to remove residual amounts of material while limiting the degree of surface abrasion. Alternatively, a touch clean can be substituted for the touch CMP process. The touch clean can use, for example, a wet clean chemistry that includes hydrofluoric acid (HF) diluted with de-ionized water (DI) in a 1000:1 ratio (DI:HF). Additionally or alternatively, the CMP process used for polishing the bulk metal 147 can entail use of a chemical formula that removes metal selective to the high aspect ratio film 139.

The resulting interconnect structure 150 shown in FIG. 7C solves many of the problems described above. Because the insulator between the metal lines includes a deep air gap, the effective dielectric constant is less than 2.0, while still providing advantageous structural properties. Thus, holes essentially have been incorporated into the dielectric material in an organized fashion so as not to weaken the overall interconnect structure. Such a low dielectric constant achieves a low capacitance between the metal lines. The ULK material between the vias can be a low-k material as well, because the mechanical strength of the high modulus insulator prevents ULK flopover during processing. The metal fill is uniform due to the larger width shallow trenches D1. The desired pitch scaling can still be maintained with the wider shallow trenches by reducing the width of the insulating structures. This pitch reduction is also made possible by use of the high modulus insulator material, as well as use of the same metal hard mask for two consecutive patterning steps. Using the golden ratio to define the ratio of the shallow trench width D1 to the width D2 of the narrow recesses results in an optimal distribution between the two structures. Finally, the depth of the narrow recesses 137 exceeds the trench depth 133 to reduce fringe capacitance at the lower corners of the metal lines where the electric field tends to be strongest.

In summary, after the structure of FIG. 7C is completed, additional layers will be placed on the top thereof, for example, perhaps repeating the layer of FIG. 7C on top of the same structure that is shown in FIG. 7C for repeated layers, for example, metal 4, metal 5, metal 6, and upper layers. The lowermost of those layers, for example, metal 2, will have to bear significantly more weight and receive more stress as the upper metal layers are deposited and formed. Accordingly, the thickness of the capping layer 139 as deposited may be custom selected to ensure that sufficient mechanical strength is provided at the particular layer where needed. At a lower layer, such as metal 2, the capping layer 139 may be somewhat thicker to provide additional mechanical strength on the sidewalls 144. Even when the air gap 141 has been formed and the capping layer 139 has sealed, or encapsulated, the top, the capping layer 139 can still be deposited on the sidewalls 144 on the outer surfaces thereof to provide additional mechanical strength if desired. In some layers, the additional mechanical strength may be desired. In other layers, such as the topmost metal layer, it may be desired to deposit the capping layer 139 sufficient to form the encapsulant 143 and to seal the recess 137 so as to form air gap 141. In some embodiments, as discussed herein, this capping layer 139 may seal off the recess 137 when little or no capping layer material has entered the air gap 141 so that the air gap has substantially the same volume as when it is first formed. The process will therefore be selected to form an air gap 141 of a desired size in conjunction with selecting a width of walls 144 and a thickness of the high aspect ratio film that forms the capping layer 139 in order to ensure sufficient mechanical strength to support the insulator between adjacent metal interconnection layers 147 while at the same time providing a large air gap 141. Circuit designers may need to select a balance between the side of the air gap 141, which has no structural strength, and the thickness of the walls 144 that provide the structural strength to make the air gap 141 as large as is practical while ensuring that the sidewalls 144 do not collapse over the lifetime that the semiconductor chip will be used, to maintain the structural integrity and long term reliability.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An interconnect structure on a semiconductor substrate, the interconnect structure comprising:
    a dielectric layer;
    an insulating material above the dielectric layer;
    an array of metal lines formed in the insulating material, the metal lines having a shallow trench depth;
    a plurality of deep air gaps positioned among the metal lines of the array, the deep air gaps extending below the shallow trench depth; and
    a capping film overlying the deep air gaps and in contact with sidewalls and a bottom wall of the deep air gaps, the capping film having sufficient density and mechanical strength to provide a structurally reinforcing layer.

2. The interconnect structure of claim 1 wherein the semiconductor substrate contains electronic devices.

3. The interconnect structure of claim 1 wherein the dielectric layer is an ultra-low-k dielectric layer having a dielectric constant less than 2.0.

4. The interconnect structure of claim 1 wherein the insulator is a high modulus insulator having a dielectric constant in the range of about 3.5-4.5.

5. The interconnect structure of claim 4 wherein an effective dielectric constant of the high modulus insulator integrated with the capping film sealing the plurality of deep air gaps is less than about 2.0.

6. The interconnect structure of claim 4 wherein the high modulus insulator includes one or more of SiN, SiC, or $SiC_xN_y$.

7. The interconnect structure of claim 4 further comprising an encapsulation layer surrounding the metal lines.

8. The interconnect structure of claim 1 wherein the deep air gaps are tapered such that the top of each deep air gap is narrower than the bottom of the deep air gap.

9. The interconnect structure of claim 1 wherein the capping film is used as the encapsulating layer.

10. The interconnect structure of claim 1 wherein the metal lines are formed having a width-to-spacing ratio of 0.618.

11. The interconnect structure of claim 1, further comprising a base layer below the dielectric layer, the base layer made of $SiC_xN_y$.

12. The interconnect structure of claim 1 wherein the capping film is a high aspect ratio film that includes SiC.

13. A damascene interconnect structure comprising:
a substrate;
an array of insulating columns formed on the substrate, each insulating column including two insulating materials;
an array of metal lines formed on the substrate, the metal lines spaced apart by the insulating columns; and
a tapered deep air gap extending vertically within one of the two insulating materials to a depth below that of the metal lines, a top of the air gap being narrower than a bottom of the air gap.

14. The interconnect structure of claim 13 wherein the insulating columns include a high modulus material.

15. The interconnect structure of claim 13 wherein the insulating columns have an insulating column width and the metal lines have a metal line width, the metal line width being a certain percentage of the insulating column width, according to a golden ratio.

16. The interconnect structure of claim 13, wherein one of the insulating materials is a capping film in contact with all sides of the air gaps.

17. The interconnect structure of claim 16 wherein the capping film is made of silicon carbide.

18. The interconnect structure of claim 16 wherein the capping film encapsulates sidewall portions of the metal lines.

19. The interconnect structure of claim 16 wherein the capping film and the air gap together form a rectangular structure having an aspect ratio that exceeds 4.0.

20. The interconnect structure of claim 13 wherein adjacent metal lines are separated from each other by more than three intervening insulating layers of the insulating columns.

* * * * *